United States Patent
Nguyen et al.

(10) Patent No.: US 11,128,326 B2
(45) Date of Patent: Sep. 21, 2021

(54) DIGITAL RADIO FREQUENCY CIRCUITRY

(71) Applicants: IMEC vzw, Leuven (BE); Vrije Universiteit Brussel, Brussels (BE)

(72) Inventors: Johan Nguyen, Halle (BE); Khaled Khalaf, Aarschot (BE); Pierre Wambacq, Groot-Bijgaarden (BE); Jan Craninckx, Boutersem (BE)

(73) Assignees: IMEC vzw, Leuven (BE); Vrije Universiteit Brassel, Brussels (BE)

( * ) Notice: Subject to any disclaimer, the term of this patent is extended or adjusted under 35 U.S.C. 154(b) by 0 days.

(21) Appl. No.: 17/098,178

(22) Filed: Nov. 13, 2020

(65) Prior Publication Data
US 2021/0152197 A1 May 20, 2021

(30) Foreign Application Priority Data

Nov. 14, 2019 (EP) ..................................... 19209056

(51) Int. Cl.
*H04B 1/04* (2006.01)
*H03F 3/193* (2006.01)
*H03F 3/72* (2006.01)
*H03G 3/00* (2006.01)
*H03G 1/00* (2006.01)

(52) U.S. Cl.
CPC ............... *H04B 1/04* (2013.01); *H03F 3/193* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 5,874,840 A | * | 2/1999 | Bonaccio | H03F 3/45076 327/55 |
| 6,064,264 A | | 5/2000 | Tarsia et al. | |
| 6,897,700 B1 | * | 5/2005 | Fu | H03F 3/45744 327/307 |

(Continued)

FOREIGN PATENT DOCUMENTS

WO    WO 2018/119153 A2    6/2018

OTHER PUBLICATIONS

Extended European Search Report dated Jun. 8, 2020 in EP Application No. EP 19209056.1.

*Primary Examiner* — Pablo N Tran
(74) *Attorney, Agent, or Firm* — Knobbe, Martens, Olson & Bear, LLP

(57) ABSTRACT

A digital radio-frequency (RF) circuitry is disclosed. In one aspect, the circuitry includes a digitally controlled amplifier configured to receive an RF input signal and a digital control signal, and to output an amplitude controlled output signal. The digitally controlled amplifier includes one or more common-source amplifying unit cells. A respective common-source amplifying unit cell includes a sources node connected to a switching circuitry controllable by the digital control signal so as to activate or deactivate the common-source amplifying unit cell. The switching circuitry comprises a first switch configured to connect the source node with a first power supply node and a second switch configured to connect the source node with a second power supply node when activating and deactivating, respectively, the common-source amplifying unit cell.

12 Claims, 5 Drawing Sheets

(56) References Cited

U.S. PATENT DOCUMENTS

| | | | |
|---|---|---|---|
| 7,298,205 B2 * | 11/2007 | Nakatani | H03F 1/22 |
| | | | 330/107 |
| 7,489,200 B2 * | 2/2009 | Chang | H03F 1/223 |
| | | | 330/278 |
| 8,766,719 B2 * | 7/2014 | Lai | H03F 3/68 |
| | | | 330/151 |
| 9,954,490 B2 * | 4/2018 | Watkins | H03F 3/265 |
| 2005/0212604 A1 * | 9/2005 | Cyr | H03B 5/1228 |
| | | | 331/16 |
| 2005/0271161 A1 | 12/2005 | Staszewski et al. | |
| 2006/0119435 A1 * | 6/2006 | Oh | H03F 3/72 |
| | | | 330/311 |
| 2006/0291589 A1 | 12/2006 | Eliezer et al. | |
| 2007/0085617 A1 * | 4/2007 | Salerno | H03B 5/1212 |
| | | | 331/167 |
| 2008/0113682 A1 * | 5/2008 | Park | H03G 3/3036 |
| | | | 455/552.1 |
| 2012/0056676 A1 | 3/2012 | Frambach | |
| 2012/0087418 A1 | 4/2012 | Zheng et al. | |
| 2012/0269291 A1 | 10/2012 | Wang et al. | |
| 2021/0143784 A1 * | 5/2021 | Khalaf | H03F 1/56 |

\* cited by examiner

DIGITAL RADIO FREQUENCY CIRCUITRY

CROSS-REFERENCE TO RELATED APPLICATIONS

This application claims foreign priority to European Application No. 19209056.1, filed Nov. 14, 2019, the content of which is incorporated by reference herein in its entirety.

BACKGROUND

Technological Field

Various example embodiments relate to a digital radio frequency (RF) circuitry.

Description of the Related Technology

A digital radio frequency (RF) circuitry produces an analogue RF signal for wired or wireless transmission. The term digital refers to the fact that the RF signal level is controlled by a digital signal. One example is a variable gain amplifier (VGA). Another example is a digital transmitter, where the RF signal is constructed by direct digital modulation in the RF domain instead of upconverting an analogue baseband signal or using analogue modulation techniques.

An example of a digital RF circuitry component is a digitally controlled amplifier, i.e., a variable gain stage in which the gain is digitally controlled by a digital modulating signal to generate an amplitude modulated output signal.

A digital polar circuitry, also referred to as a digital polar transmitter, may make use of such a digitally controlled amplifier. A digital polar circuitry may comprise a phase shifter and a digitally controller amplifier. The phase shifter modulates a digital phase modulating signal onto a carrier signal, thereby producing a phase modulated signal. This signal is then further modulated in amplitude by the digital modulating signal in the digitally controlled amplifier to produce an amplitude modulated signal.

A digitally controlled amplifier may be subject to leakage, i.e., the amplifier produces an excess output voltage for low values of the digital modulating signal. This leakage further results in high error vector magnitude (EVM). Furthermore, leakage reduces the number of constellation points because all constellation points that are close to the origin will move towards this minimum excess output voltage.

SUMMARY OF CERTAIN INVENTIVE ASPECTS

The scope of protection sought for various embodiments of the invention is set out by the independent claims.

The embodiments and features described in this specification that do not fall within the scope of the independent claims, if any, are to be interpreted as examples useful for understanding various embodiments of the invention.

Amongst others, it is an object of embodiments of the disclosed technology to alleviate the above-identified leakage problem.

This object is achieved, according to a first example aspect of the present disclosure, by a digital RF circuitry comprising a digitally controlled amplifier further configured to receive an input signal and a digital control signal, and to output an amplitude controlled output signal. The digitally controlled amplifier comprises one or more common-source amplifying unit cells. Such a respective common-source amplifying unit cell comprises a sources node connected to a switching circuitry controllable by the digital control signal so as to activate or deactivate the common-source amplifying unit cell. The switching circuitry then comprises a first and second switch configured to connect the source node with a first respective second power supply node when activating respectively deactivating the common-source amplifying unit cell.

The digitally controlled amplifier thus achieves its gain by a chain of common-source amplifying unit cells with a fixed gain that can be activated or deactivated to achieve the instant gain as represented by the digital control signal. In its simplest form, a single unit cell may be used, for example, when performing binary phase shift keying. Each amplifier in the chain amplifies the energy level and, thus, the amplitude of the output signal. To do so, the cells have a common-source amplifier topology. The common-source amplifier topology may, for example, be achieved by a single ended common source amplifier or by a differential common source amplifier. Each of the common source amplifiers is switched at the source node to achieve the activation or deactivation. This switching is performed by two switches. The first switch is conducting when activating the common-source amplifier by connecting its source node with the first power supply node and non-conducting when deactivating the common-source amplifier by disconnecting the source node from the first power supply node. The second switch is conducting when deactivating the common-source amplifier by connecting its source node with the second power supply node and non-conducting when activating the common-source amplifier by disconnecting the source node from the second power supply node.

By the second switch, the source node of the amplifier is not floating when the amplifier is disconnected but pulled to the second power supply node, thereby ensuring that the common source amplifier is completely switched off when deactivated. This brings the common source amplifier in a deeper class C state when switched off, thereby reducing leakage from the amplifier's input gate to its output. This further results in a better linearity at the output. Furthermore, by the second switch, the switching is performed faster because the source node is actively pulled to the second power supply node. This faster switching is beneficial for digital RF circuits because the bandwidth of the digital control signal is typically larger than the bandwidth of the original communication signal. The combination of the first and second switch may, for example, be achieved by an inverter switch.

This source switched digitally controlled amplifier has a better performance than drain switched topologies because the insertion loss of the switch is replaced by a less harmful degeneration. The source switched digitally controlled amplifier also has a better performance than a gate switched topology because there is no trade-off between switching speed and signal loading. For a gate switched topology, where the gate bias is switched between a bias voltage and ground, a lower biasing resistor value will increase the switching speed but reduces the gain of the amplifier and thus lowers the efficiency.

According to an embodiment, the first power supply node corresponds to a common ground node and the second power supply node corresponds to a positive voltage supply node. The first switch may then further correspond to an nMOS type transistor and the second switch to a pMOS type transistor. The common source amplifying unit cell may then have one or more nMOS type transistors.

Alternatively, the first power supply node corresponds to a positive voltage supply node and the second power supply node corresponds to a common ground node. The first switch may then further correspond to an pMOS type transistor and the second switch to a nMOS type transistor. The common source amplifying unit cell may then have one or more pMOS type transistors.

According to example embodiments, the digital RF circuitry further comprises a driver configured to drive the input of the digitally controlled amplifier by the RF input signal. The driver then comprises a plurality of driver circuitries connected in parallel and a driver switching circuitry for toggling the respective driver circuitries. The digital RF circuitry is then further configured to toggle off one or more of the driver circuitries when the value of the digital control signal is below a threshold.

In other words, the driver of the digitally controlled amplifier is dynamic and lowers the power of the RF input signal for lower values of the digital control signal. This way, less power is provided to the input of the digitally controlled amplifier and even less leakage will occur.

Advantageously, the digital RF circuitry is further configured to gradually toggle the driver circuitries off with decreasing gain values of the digital control signal.

According to a further aspect, a digital polar transmitter is disclosed that comprises the digital RF circuitry according to the above aspect. The RF input signal is then a phase modulated input signal and the digital control signal is then the digital amplitude modulating signal. This phase modulated input signal may for example by provided by a phase shifter.

According to a further aspect, a digital Cartesian transmitter is disclosed that comprises the digital RF circuitry according to the above aspect. The input RF signal is then the carrier signal, and the digital control signal is the digital in-phase, I, or out-of-phase, Q, modulating signal.

BRIEF DESCRIPTION OF THE DRAWINGS

Some example embodiments will now be described with reference to the accompanying drawings.

DETAILED DESCRIPTION OF CERTAIN ILLUSTRATIVE EMBODIMENTS

Figure 1:
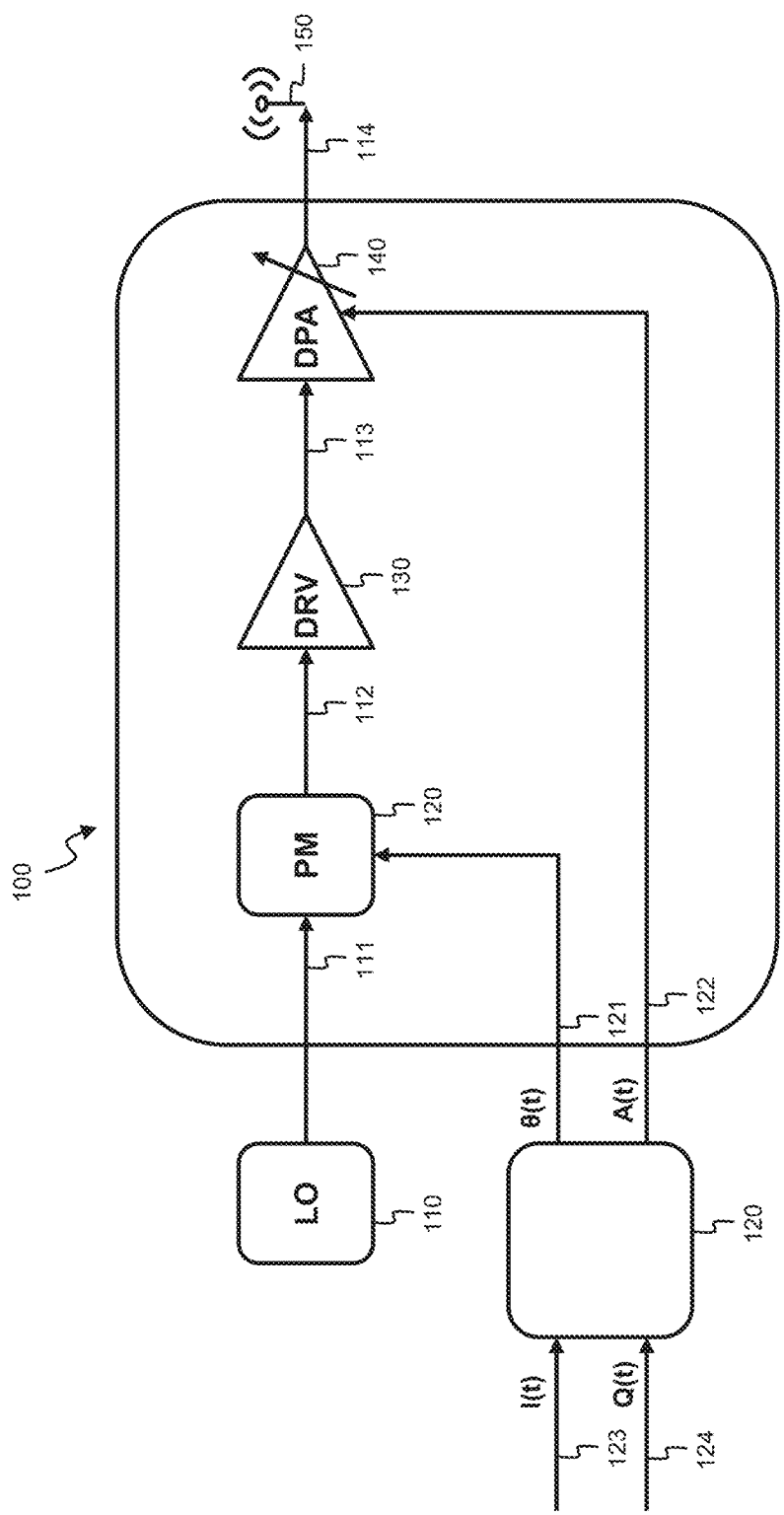
FIG. 1 shows an example embodiment of a digital polar circuitry.

FIG. 1 shows a digital polar circuitry 100 according to an example embodiment. The circuitry 100 may receive a carrier signal 111 with a constant amplitude and frequency, for example, a sine wave signal. The carrier signal 111 may, for example, be generated by an oscillation circuitry 110. The circuitry 100 comprises a phase shifter 120 configured to modulate a phase modulating signal 121 onto the carrier signal 111, a digitally controlled amplifier 140 to modulate a digital modulating or control signal 122 onto the phase modulated signal 113 by varying the gain of the amplifier accordingly. The result is a communication signal 114 modulated in both phase and amplitude which may then be further transmitted by an antenna 150. The circuitry 100 may further comprise one or more drivers 130 for driving the input of the digitally controlled amplifier 140.

The phase and digital modulating signals 121, 122 are the respective phase and amplitude components of a digital time varying information signal. The signals 121, 122 may be obtained from a digital baseband circuitry 120. This circuitry 120 may derive the signal 121, 122 from in-phase, I-, and quadrature-phase, Q-, components 123, 124 of the time varying information signal.

Figure 2:
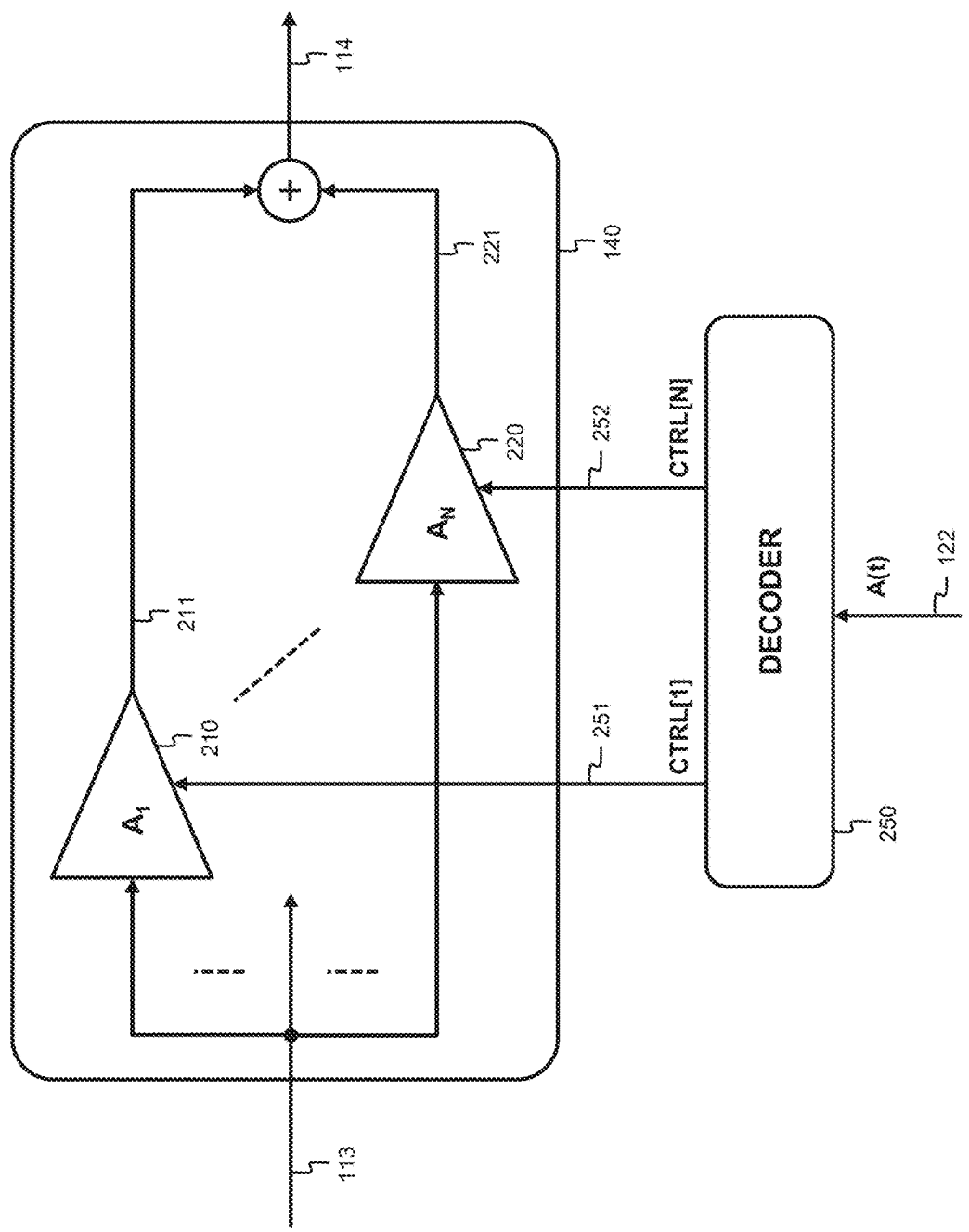
FIG. 2 shows an example embodiment of a digitally controlled amplifier.

FIG. 2 illustrates the digitally controlled amplifier 140 according to an example embodiment. Digitally controlled amplifier 140 comprises a plurality of fixed gain amplifying unit cells 210, 220 each receiving the phase modulated signal 113 as input and respectively producing a portion 211, 221 of the output signal 114. The unit cells 210, 220 are further configured to be activated or deactivated by a control signal CTRL[i] 251, 252 with i=1 . . . N and N representing the number of unit cells. When a unit cell is activated, it amplifies the input signal 113 thereby contributing to a portion of the output signal 114. When a unit cell is deactivated, it does not amplify the input signal 113 and does not contribute to the output signal 114. By the control signals 251, 252 the amplitude of the output signal 114 may be modulated in time. Thereto, control signals 251, 252 are derived from the digital modulating signal 122. For example, when the fixed gain amplifiers have an equal gain, then the decoder may transform the binary represented digital signal 122 to a thermometer coded signal wherein each bit of the thermometer code corresponds to one of the control signals 251, 252. Alternatively, binary coding may be used. A decoder 250 may further apply pre-distortion to overcome non-idealities in the fixed gain amplifiers 210, 220.

Figure 3:
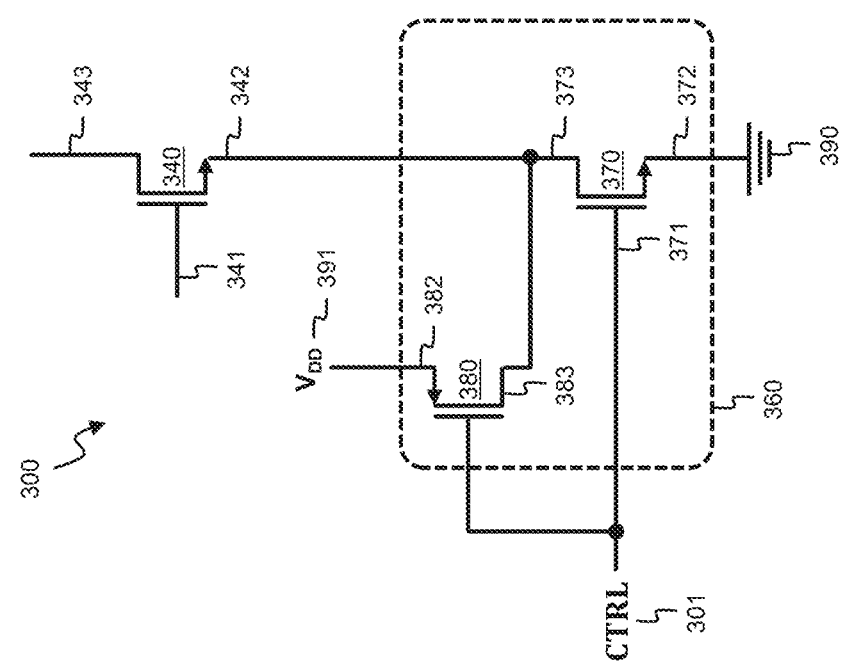
FIG. 3 shows an example embodiment of a single ended common source amplifying unit cell.

Fixed gain unit cells 210, 220 may be embodied as the fixed gain amplifier 300 as illustrated in FIG. 3. The fixed gain amplifier 300 has a single ended common source amplifier topology with amplifying nMOS-type transistor 340. The gate 341 of the transistor 340 serves as input for the phase modulated input signal 113. The drain node 343 is connected to the load of the amplifier and, thus, serves as output 211, 221 for providing the amplified portion of the output signal 114. The load is then further connected with the positive voltage supply 391. The source 342 serves as the common node of the amplifier and is connected to the ground node 390 when activated. Activation of the amplifier 300 is performed by an nMOS transistor 370 which serves as a switch by the connection of its drain 373 with the source node 342 and by the connection of its source 372 with the common ground node 390. The gate 371 of the switch 370 is controlled by the control signal 301 which may correspond with any of the control signals 251, 252. When the control signal 301 is high, i.e. a binary '1', then the transistor 370 conducts and connects the node 342 electrically with the ground node 390. When deactivating the fixed gain amplifier 300 by control signal 301, the source node 342 of the transistor 340 is connected with the positive voltage supply 391. This is achieved by a pMOS transistor 380 that serves as a second switch. When the control signal 301 is low, i.e., a binary '0', then the transistor 380 conducts and connects the node 342 electrically with the positive voltage supply node 391. As the source node 342 of the amplification transistor 340 is then connected with the positive voltage supply node 391, the transistor 340 is in a deep off state regardless of the voltage at the gate node 341, i.e., regardless of the input signal 113. The switching circuitry 360 comprising the switches 370, 380 correspond to a CMOS switch or, more general, to an inverter switch.

The example of FIG. 3 may also be embodied with a pMOS type amplifying transistor wherein the common node, i.e., the source of the pMOS transistor, is connected to the positive voltage supply node 391 during activation.

Figure 4:
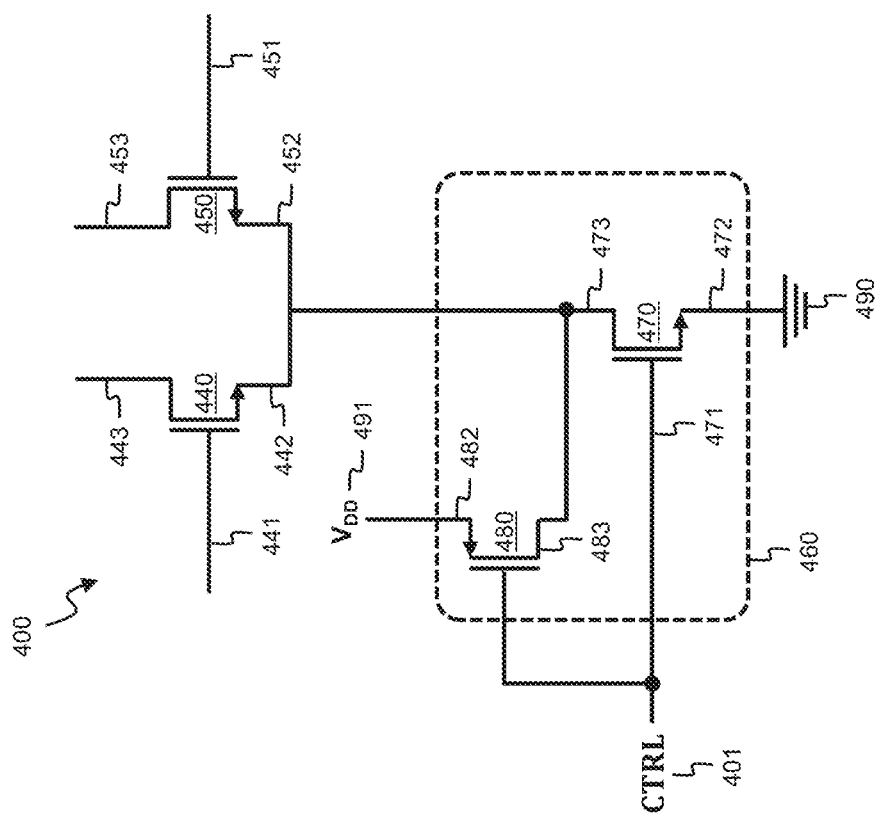
FIG. 4 shows another example embodiment of a differential common source amplifying unit cell.

Fixed gain amplifiers 210, 220 may also be embodied as the fixed gain amplifier 400 as illustrated in FIG. 4. A fixed gain amplifier 400 has a differential common source amplifier topology with amplifying nMOS-type transistors 440, 450. The gates 441, 451 of the respective transistors 440, 450 serve as differential input for the phase modulated input signal 113, i.e., the input signal 113 is represented by the electrical difference between gate nodes 441 and 451. The drain nodes 443, 453 are connected to the load of the amplifier and, thus, the electrical difference between nodes 443 and 453 serves as an where wire output 211, 221 each represent two differential output wires for providing the amplified portion of the output signal 114. The load is then further connected with the positive voltage supply 491 in a differential fashion. The source nodes 442, 452 serve as the common node of the amplifier and are connected to the ground node 490 when activated. Activation of the amplifier 400 is performed by an nMOS transistor 470 which serves as a switch by connection of its drain 473 with the source nodes 442, 452 and by connection of its source 472 with the common ground node 490. The gate 471 of the switch 470 is controlled by the control signal 401 which may correspond with any of the control signals 251, 252. When the control signal 401 is high, i.e., a binary '1', then the transistor 470 conducts and connects the nodes 442 and 452 electrically with ground node 490. When deactivating the fixed gain amplifier 400 by control signal 401, the source nodes 442, 452 of the transistors 440, 450 are connected with the positive voltage supply 491. This is done by a pMOS transistor 480 that serves as a second switch. When the control signal 401 is low, i.e., a binary '0', then the transistor 480 conducts and connects the node 442 electrically with voltage supply node 491. As the source nodes 442, 452 of the amplification transistors 440, 450 are then connected with the voltage supply node 491, the transistors 440 and 450 enter a deep off state regardless of the voltage at the gate nodes 441, 451, i.e., regardless of the input signal 113. The switching circuitry 460 comprising the switches 470, 480 corresponds to a CMOS switch or, more generally, to an inverter switch.

The example of FIG. 4 may also be embodied with two pMOS type amplifying transistors wherein the common node, i.e., the sources of the pMOS transistors, are connected to the positive voltage supply node 491 during activation.

The example of FIG. 4 may also be embodied with the source nodes 442, 452 decoupled and with separate switching circuitries 460 for connecting the source nodes to the common ground node 490. In other words, by two separate instances of the single ended fixed gain amplifier 300 but with differentially excited input nodes 341. According to yet another example embodiment, two instances of switching circuitry 460 may be connected to the common source node 442, 452. In this case, the switching strength is increased resulting in a higher speed and symmetrical design.

Figure 5:
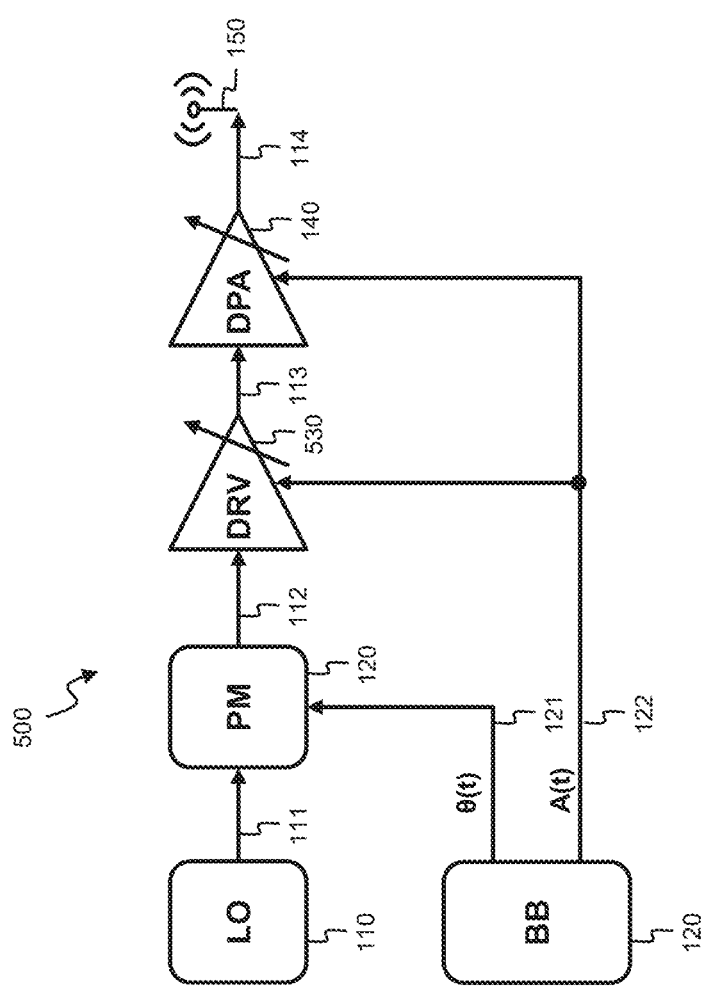
FIG. 5 shows another example embodiment of a digital polar circuitry.

FIG. 5 illustrates a digital polar circuitry 500 according to another example embodiment. Circuitry 500 differs from circuitry 100 by dynamic driver circuitry 530. A driver 530 will adapt the driver amplification based on the digital modulating signal 122 to further reduce leakage of the input signal 112 to the output 114 through deactivated amplifiers in the digitally controlled amplifier 140. This is achieved by lowering the gain of the driver circuitry 530 for lower values of the digital modulating signal 122. For example, the gain of the driver 530 is lowered when the digital modulating signal drops below a certain threshold, i.e., for lower codes of the digital modulating signal 122. The gain may further be gradually reduced with decreasing values of the digital modulating signal 122 from the threshold value onwards. This technique will cause a non-linear drop in the amplitude of the output signal for values below this threshold. To account for this, a digital pre-distortion may be applied to compensate for this effect, for example, by the baseband circuitry 120 or within the decoder 122.

Figure 6:
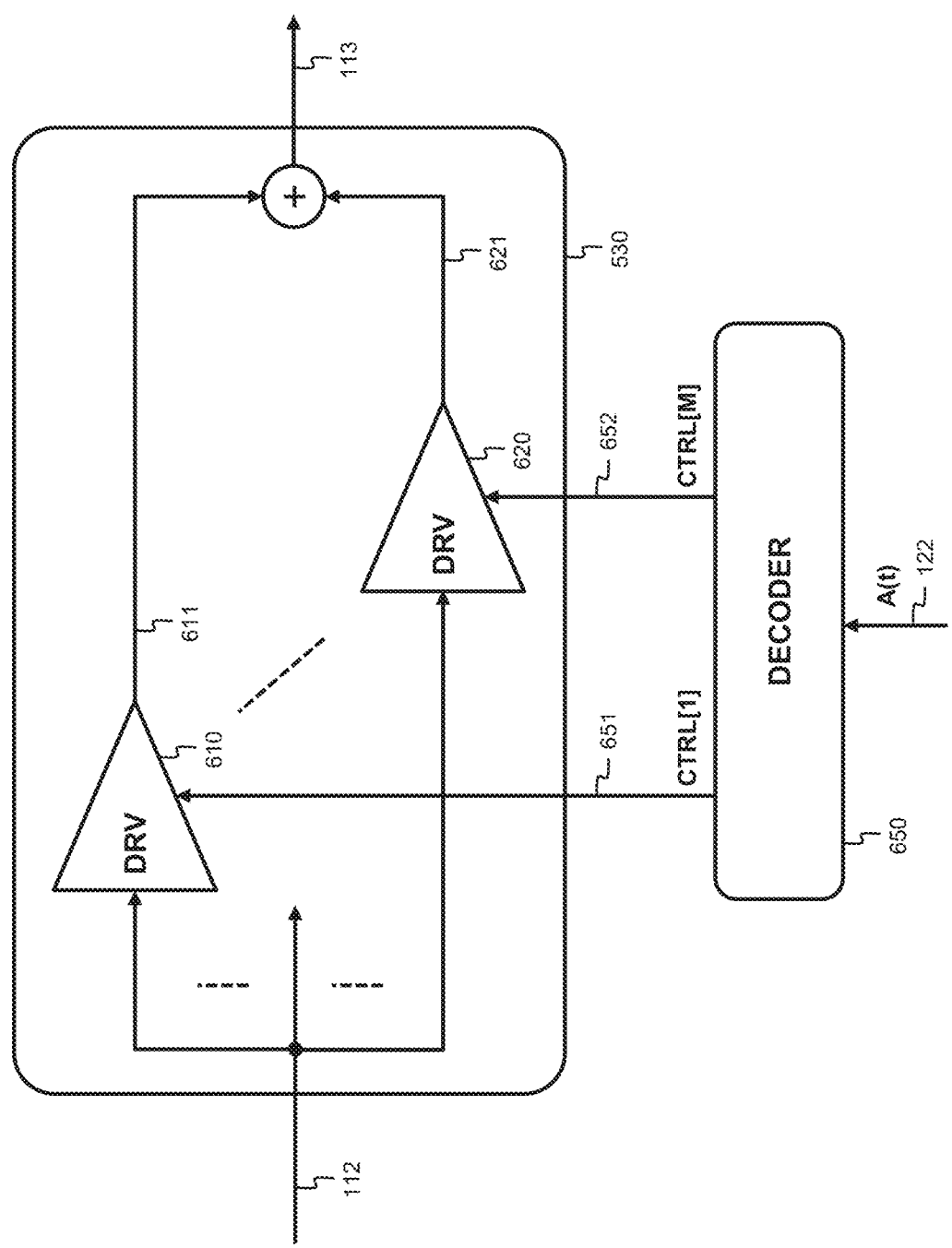
FIG. 6 shows an example embodiment of a driver circuitry.

Dynamic driver circuitry 530 may be further embodied as illustrated in FIG. 6. The circuitry 530 then comprises a plurality of drivers 610, 620 that are connected in parallel, each contributing to a portion of the signal 113 for driving the digitally controlled amplifier. The drivers are controlled by control signals 651, 652 that are, on their turn, generated by decoder 650 from the digital modulating signal 122. Decoder 650 may, for example, enable all drivers when the signal 122 is above a certain value and gradually disable the drivers when the signal 122 drops below this threshold value. The drivers 610, 620 may be embodied similar to amplifiers 300 or 400 but with a load at the outputs 343, 443, 453 of the drivers configured to drive the inputs 341, 441, 451 of the following digitally controlled amplifier 140.

Digital polar circuitries may comprise a digitally controlled amplifier 140 with a cascade of the buffer circuitries 530, 130. The number of buffer circuitries may then be selected depending on the driving needs of the digitally controlled amplifier 140 and its load, for example, an antenna 150, or depending on the specification of the circuit in front of the first driving stage, for example, the compressing point of such a preceding circuit.

The digitally controlled amplifier in the above embodiments has been illustrated for a digital polar transmitter, but may also be embodied in other digital RF circuitries, for example in a Cartesian transmitter architecture.

As used in this application, the term "circuitry" may refer to one or more or all of the following. (a) hardware-only circuit implementations such as implementations in only analog and/or digital circuitry and (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions) and (c) hardware circuit(s) and/or processor(s), such as microprocessor(s) or a portion of a microprocessor(s), that requires software (e.g. firmware) for operation, but the software may not be present when it is not needed for operation.

This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in a server, a cellular network device, or other computing or network device.

Although the present invention has been illustrated by reference to specific embodiments, it will be apparent to those skilled in the art that the invention is not limited to the details of the foregoing illustrative embodiments, and that the present invention may be embodied with various changes and modifications without departing from the scope thereof. The present embodiments are therefore to be considered in all respects as illustrative and not restrictive, the scope of the invention being indicated by the appended claims rather than by the foregoing description, and all changes which come within the scope of the claims are therefore intended to be embraced therein.

It will furthermore be understood by the reader of this patent application that the words "comprising" or "comprise" do not exclude other elements or steps, that the words "a" or "an" do not exclude a plurality, and that a single element, such as a computer system, a processor, or another integrated unit may fulfil the functions of several means recited in the claims. Any reference signs in the claims shall not be construed as limiting the respective claims concerned. The terms "first", "second", third", "a", "b", "c", and the like, when used in the description or in the claims are introduced to distinguish between similar elements or steps and are not necessarily describing a sequential or chronological order. Similarly, the terms "top", "bottom", "over", "under", and the like are introduced for descriptive purposes and not necessarily to denote relative positions. It is to be understood that the terms so used are interchangeable under appropriate circumstances and embodiments of the disclosed technology are capable of operating according to the disclosed technology in other sequences, or in orientations different from the one(s) described or illustrated above.

What is claimed is:

1. A digital radio-frequency (RF) circuitry comprising:
a digitally controlled amplifier configured to:
receive an RF input signal and a digital control signal, and
output an amplitude controlled output signal, wherein the digitally controlled amplifier comprises one or more common-source amplifying unit cells, wherein a respective common-source amplifying unit cell comprises a sources node connected to a switching circuitry controllable by the digital control signal to activate or deactivate the common-source amplifying unit cells, and wherein the switching circuitry comprises a first switch configured to connect the source node with a first power supply node and a second switch configured to connect the source node with a second power supply node when activating and deactivating, respectively, the common-source amplifying unit cell.

2. The digital RF circuitry of claim 1, wherein the common-source amplifying unit cell has a fixed gain.

3. The digital RF circuitry of claim 1, wherein the switching circuitry corresponds to an inverter switch.

4. The digital RF circuitry of claim 1, wherein the common-source amplifying unit cell corresponds to a single ended common source amplifier.

5. The digital RF circuitry of claim 1, wherein the common-source amplifying unit cell corresponds to a differential common source amplifier.

6. The digital RF circuitry of claim 1, wherein the first power supply node corresponds to a common ground node and the second power supply node corresponds to a positive voltage supply node.

7. The digital RF circuitry of claim 6, wherein the first switch comprises an nMOS type transistor and the second switch comprises a pMOS type transistor.

8. The digital RF circuitry of claim 1, further comprising a driver configured to drive the input of the digitally controlled amplifier by the RF input signal.

9. The digital RF circuitry of claim 8, wherein the driver comprises a plurality of driver circuitries connected in parallel and a driver switching circuitry for toggling the respective driver circuitries, and wherein the digital RF circuitry is further configured to toggle off one or more of the driver circuitries when a value of the digital control signal is below a threshold.

10. The digital RF circuitry of claim 9, further configured to gradually toggle the driver circuitries off with decreasing values of the digital control signal.

11. A digital polar transmitter comprising the digital RF circuitry of claim 1, wherein the input RF signal is a phase modulated input signal, and the digital control signal is a digital amplitude modulating signal.

12. A digital Cartesian transmitter comprising the digital RF circuitry of claim 1, wherein the input RF signal is a carrier signal, and the digital control signal is a digital in-phase, I, or out-of-phase, Q, modulating signal.

* * * * *